(12) United States Patent
Matsumura et al.

(10) Patent No.: US 11,916,521 B2
(45) Date of Patent: Feb. 27, 2024

(54) RADIO-FREQUENCY MODULE AND COMMUNICATION APPARATUS

(71) Applicant: Murata Manufacturing Co., Ltd., Nagaokakyo (JP)

(72) Inventors: Yoshito Matsumura, Nagaokakyo (JP); Morio Takeuchi, Nagaokakyo (JP); Yukiya Yamaguchi, Nagaokakyo (JP); Shigeru Tsuchida, Nagaokakyo (JP); Hidetaka Takahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 444 days.

(21) Appl. No.: 17/341,393

(22) Filed: Jun. 8, 2021

(65) Prior Publication Data

US 2022/0021356 A1 Jan. 20, 2022

(30) Foreign Application Priority Data

Jul. 16, 2020 (JP) .................................. 2020-122419

(51) Int. Cl.
*H04B 1/04* (2006.01)
*H03F 3/21* (2006.01)
*H03F 1/56* (2006.01)
*H04B 1/00* (2006.01)

(52) U.S. Cl.
CPC .............. *H03F 3/211* (2013.01); *H03F 1/56* (2013.01); *H04B 1/006* (2013.01); *H04B 1/0475* (2013.01); *H03F 2200/387* (2013.01); *H03F 2200/451* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 11,128,268 B1* | 9/2021 | Kishore | H01L 23/047 |
| 2005/0030107 A1* | 2/2005 | Shimizu | H01L 23/66 |
| | | | 330/307 |
| 2018/0062237 A1* | 3/2018 | Oohashi | H03H 7/48 |
| 2022/0021126 A1* | 1/2022 | Tanoue | H01Q 1/20 |
| 2022/0190849 A1* | 6/2022 | Shinozaki | H01L 23/12 |
| 2023/0283306 A1* | 9/2023 | Kani | H04B 1/18 |
| | | | 455/552.1 |
| 2023/0291369 A1* | 9/2023 | Kim | H01L 23/552 |
| | | | 330/295 |

FOREIGN PATENT DOCUMENTS

JP 2018-137522 A 8/2018

* cited by examiner

*Primary Examiner* — Pablo N Tran
(74) *Attorney, Agent, or Firm* — XSENSUS LLP

(57) ABSTRACT

A radio-frequency module includes a mounting substrate and first and second power amplifiers. The first and second power amplifiers are each mounted on one main surface of the mounting substrate. The first power amplifier includes a first input terminal and a first outer periphery. The first outer periphery includes a first edge section. The second power amplifier includes a second input terminal and a second outer periphery. The second outer periphery includes a second edge section. The second edge section opposes the first edge section in a first direction. The first input terminal is disposed in the first edge section of the first power amplifier. The second input terminal is disposed in the second edge section of the second power amplifier. The first and second input terminals do not overlap each other in the first direction.

20 Claims, 7 Drawing Sheets

RADIO-FREQUENCY MODULE AND COMMUNICATION APPARATUS

CROSS-REFERENCE TO RELATED APPLICATION

The present application claims priority to Japanese patent application JP2020-122419, filed Jul. 16, 2020, the entire contents of which being incorporated herein by reference.

BACKGROUND

1. Field

The present disclosure generally relates to a radio-frequency module and a communication apparatus, and more particularly to a radio-frequency module including plural power amplifiers and to a communication apparatus including this radio-frequency module.

2. Description of the Related Art

Japanese Unexamined Patent Application Publication No. 2018-137522 discloses a radio-frequency module including plural amplifiers (first and second power amplifiers) that amplify transmit signals.

SUMMARY

In the above-described radio-frequency module, it is desirable to achieve a technology for sending multiple transmit signals. In this radio-frequency module, however, as recognized by the present inventors, when sending transmit signals, the transmit signals may interfere with each other between the plural power amplifiers.

One aspect of the present disclosure to provide a radio-frequency module and a communication apparatus that are able to reduce the interference of transmit signals between first and second power amplifiers.

According to an aspect of the present disclosure, there is provided a radio-frequency module including a mounting substrate and first and second power amplifiers. The mounting substrate has a main surface. The first power amplifier is mounted on the main surface of the mounting substrate and is configured to amplify a first transmit signal. The second power amplifier is mounted on the main surface of the mounting substrate and is configured to amplify a second transmit signal. The first power amplifier includes a first input terminal and a first outer periphery. The first outer periphery includes a first edge section. The first transmit signal is input into the first input terminal. The second power amplifier includes a second input terminal and a second outer periphery. The second outer periphery includes a second edge section which opposes the first edge section in a first direction. The second transmit signal is input into the second input terminal. The first input terminal of the first power amplifier and the second input terminal of the second power amplifier are disposed in one of a first manner and a second manner. In the first manner, the first input terminal is disposed in the first edge section of the first power amplifier, and the second input terminal is disposed in the second edge section of the second power amplifier, and the first input terminal and the second input terminal do not overlap each other in the first direction. In the second manner, the first input terminal is disposed in a portion of the first outer periphery of the first power amplifier other than in the first edge section, and the second input terminal is disposed in a portion of the second outer periphery of the second power amplifier other than in the second edge section.

According to another aspect of the present disclosure, there is provided a communication apparatus including the radio-frequency module and a signal processing circuit. The signal processing circuit outputs the first transmit signal and the second transmit signal to the radio-frequency module.

According to aspects of the present disclosure, it is possible to reduce the interference of transmit signals between the first and second power amplifiers.

Other features, elements, characteristics, and advantages of the present disclosure will become more apparent from the following detailed description of preferred embodiments of the present disclosure with reference to the attached drawings.

DESCRIPTION OF THE EMBODIMENTS

The drawings to be referred to in the following embodiments only schematically illustrate elements, and the ratio between the elements in terms of the size and that of the thickness do not necessarily reflect the actual dimensional ratios between the elements.

(1) First Embodiment

A radio-frequency module 1 and a communication apparatus 10 according to a first embodiment will be described below with reference to FIGS. 1 through 4.

(1-1) Configurations of Radio-Frequency Module and Communication Apparatus

The configurations of the radio-frequency module 1 and the communication apparatus 10 will first be described below with reference to FIG. 1. The radio-frequency module 1 is used in the communication apparatus 10, for example. The radio-frequency module 1 supports communication technologies such as carrier aggregation and dual connectivity.

The communication apparatus 10 is a cellular phone, such as a smartphone, or a wearable terminal, such as a smartwatch. The radio-frequency module 1 supports communication standards such as the fourth generation (4G) and the fifth generation (5G). 4G is Third Generation Partnership Project (3GPP) Long Term Evolution (LTE), for example. 5G is 5G New Radio (NR), for example.

Figure 1:
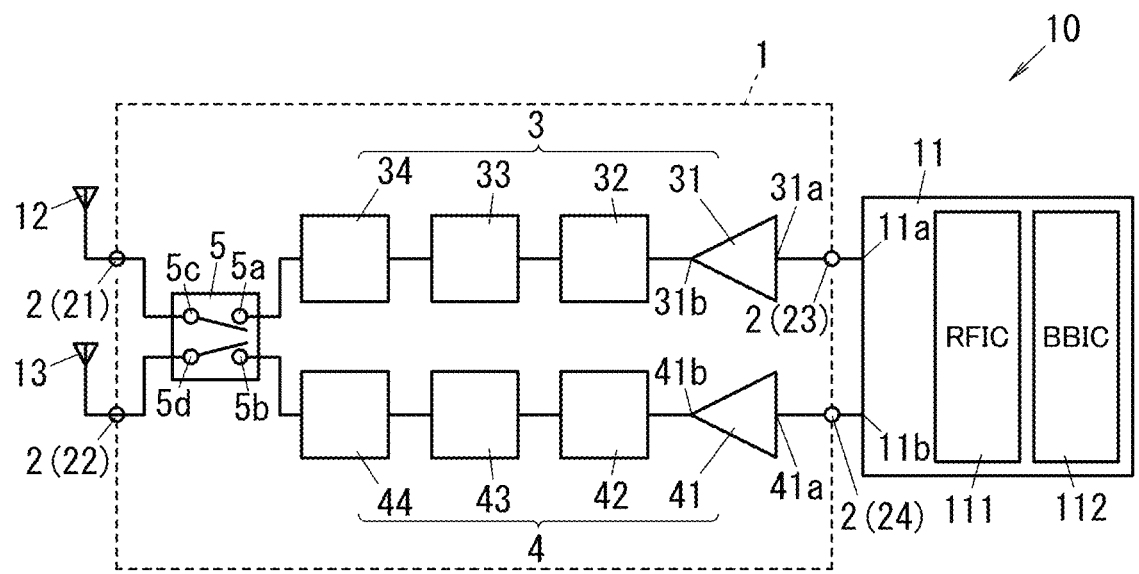
FIG. 1 is a block diagram illustrating a radio-frequency module and a communication apparatus according to a first embodiment.

The communication apparatus 10 includes the radio-frequency module 1, a signal processing circuit 11, and plural antennas (two antennas 12 and 13 in the example in FIG. 1).

The signal processing circuit 11 generates a transmit signal of a predetermined frequency band from a signal received from an external source. The predetermined frequency band includes different communication bands, such as first and second communication bands. The first communication band is high-band (2.3 to 2.7 GHz, for example) frequency bands. The second communication band is mid-band (1.7 to 2.2 GHz, for example) frequency bands.

The signal processing circuit 11 includes a radio-frequency (RF) signal processing circuit 111 and a baseband signal processing circuit 112. The RF signal processing circuit 111 is a radio-frequency integrated circuit (RFIC), for example, and performs signal processing on radio-frequency signals. More specifically, the RF signal processing circuit 111 performs signal processing, such as up-conversion, on transmit signals received from the baseband signal processing circuit 112 so as to generate transmit signals of the above-described predetermined frequency band. The baseband signal processing circuit 112 is a baseband integrated circuit (BBIC), for example. The baseband signal processing circuit 112 generates an in (I)-phase signal and a quadrature (Q)-phase signal from a signal (baseband signal) received from an external source, and performs IQ modulation processing by combining the generated I-phase and Q-phase signals so as to generate transmit signals. The baseband signal processing circuit 112 then outputs the generated transmit signals to the RF signal processing circuit 111. The baseband signal is an audio signal or an image signal, for example. The transmit signals generated by the baseband signal processing circuit 112 are modulated signals (IQ signals) generated as a result of a carrier signal of a predetermined frequency being subjected to amplitude modulation with a period longer than that of the carrier signal. The signals processed by the baseband signal processing circuit 112 are used as image signals for displaying an image or as audio signals for performing communication.

The signal processing circuit 11 includes plural signal output terminals (two signal output terminals 11a and 11b in the example in FIG. 1). The signal processing circuit 11 simultaneously outputs the generated transmit signals (first and second transmit signals) to the radio-frequency module 1 via the two signal output terminals 11a and 11b.

The radio-frequency module 1 performs various types of signal processing, such as amplification and filter processing, simultaneously on the transmit signals of the predetermined frequency band output from the two signal output terminals 11a and 11b. The radio-frequency module 1 then outputs the two transmit signals from the two antennas 12 and 13 at the same time. In this manner, the radio-frequency module 1 simultaneously performs communication using a transmit signal in the first communication band and communication using a transmit signal in the second communication band. This makes it possible to send transmit signals to a communication partner, such as a base station, by using different communication bands (first and second communication bands).

(1-2) Detailed Configuration of Radio-Frequency Module

The configuration of the radio-frequency module 1 will now be discussed below in detail with reference to FIG. 1. The radio-frequency module 1 includes multiple external connecting terminals 2, a first transmit circuit 3, a second transmit circuit 4, and a switch 5.

The multiple external connecting terminals 2 include plural antenna terminals (two antenna terminals 21 and 22 in the example in FIG. 1) and plural signal input terminals (two signal input terminals 23 and 24 in the example in FIG. 1). The antenna terminals 21 and 22 are associated with and connected to the antennas 12 and 13 based on a one-on-one correspondence. The signal input terminals 23 and 24 are associated with and connected to the signal output terminals 11a and 11b of the signal processing circuit 11 based on a one-on-one correspondence.

The first transmit circuit 3 performs various types of signal processing, such as amplification and filter processing, on a transmit signal in the first communication band (first transmit signal) input into the signal input terminal 23 and outputs the first transmit signal to the switch 5. The second transmit circuit 4 performs various types of signal processing, such as amplification and filter processing, on a transmit signal in the second communication band (second transmit signal) input into the signal input terminal 24 and outputs the second transmit signal to the switch 5. The first and second transmit circuits 3 and 4 are able to execute various types of signal processing at the same time.

The first transmit circuit 3 includes a first power amplifier 31, a first output matching circuit 32, a first transmit filter 33, and a first matching circuit 34.

The first power amplifier 31 has an input terminal 31a (first input terminal) and an output terminal 31b (first output terminal). The input terminal 31a is connected to the signal input terminal 23. The output terminal 31b is connected to the input terminal of the first output matching circuit 32. The first power amplifier 31 amplifies the first transmit signal input into the input terminal 31a and outputs the amplified first transmit signal from the output terminal 31b. The first transmit signal input into the input terminal 31a is a transmit signal to be sent from one (first antenna) of the two antennas 12 and 13.

The first transmit filter 33 is a filter using the first communication band as the pass band. The first transmit filter 33 has an input terminal and an output terminal. The input terminal of the first transmit filter 33 is connected to the output terminal of the first output matching circuit 32. The output terminal of the first transmit filter 33 is connected to the input terminal of the first matching circuit 34. The first transmit filter 33 allows transmit signals only in the first communication band to pass therethrough and outputs the transmit signals from the output terminal of the first transmit filter 33. In the first embodiment, the first transmit filter 33 forms a duplexer, together with a receive filter (not shown).

The first output matching circuit 32 performs matching processing for providing impedance matching between the first power amplifier 31 and the first transmit filter 33. The first output matching circuit 32 is disposed on a path between the output terminal 31b of the first power amplifier 31 and the input terminal of the first transmit filter 33. The first output matching circuit 32 performs matching processing on the first transmit signal output from the first power amplifier 31 and outputs the first transmit signal to the input terminal of the first transmit filter 33.

The first matching circuit 34 performs matching processing for providing impedance matching between the first transmit filter 33 and the switch 5. The first matching circuit 34 is disposed on a path between the output terminal of the first transmit filter 33 and an input terminal 5a of the switch 5. The first matching circuit 34 performs matching processing on the first transmit signal output from the first transmit filter 33 and outputs the first transmit signal to the input terminal 5a of the switch 5.

The second transmit circuit 4 includes a second power amplifier 41, a second output matching circuit 42, a second transmit filter 43, and a second matching circuit 44.

The second power amplifier 41 has an input terminal 41a (second input terminal) and an output terminal 41b (second output terminal). The input terminal 41a is connected to the signal input terminal 24. The output terminal 41b is connected to the input terminal of the second output matching circuit 42. The second power amplifier 41 amplifies the second transmit signal input into the input terminal 41a and outputs the amplified second transmit signal from the output terminal 41b. The second transmit signal input into the input terminal 41a is a transmit signal to be sent from the other one (second antenna) of the two antennas 12 and 13.

The second transmit filter 43 is a filter using the second communication band as the pass band. The second transmit filter 43 has an input terminal and an output terminal. The input terminal of the second transmit filter 43 is connected to the output terminal of the second output matching circuit 42. The output terminal of the second transmit filter 43 is connected to the input terminal of the second matching circuit 44. The second transmit filter 43 allows transmit signals only in the second communication band to pass therethrough and outputs the transmit signals from the output terminal of the second transmit filter 43. In the first embodiment, the second transmit filter 43 forms a duplexer, together with a receive filter (not shown).

The second output matching circuit 42 performs matching processing for providing impedance matching between the second power amplifier 41 and the second transmit filter 43. The second output matching circuit 42 is disposed on a path between the output terminal 41b of the second power amplifier 41 and the input terminal of the second transmit filter 43. The second output matching circuit 42 performs matching processing on the second transmit signal output from the second power amplifier 41 and outputs the second transmit signal to the input terminal of the second transmit filter 43.

The second matching circuit 44 performs matching processing for providing impedance matching between the second transmit filter 43 and the switch 5. The second matching circuit 44 is disposed on a path between the output terminal of the second transmit filter 43 and an input terminal 5b of the switch 5. The second matching circuit 44 performs matching processing on the second transmit signal output from the second transmit filter 43 and outputs the second transmit signal to the input terminal 5b of the switch 5.

The switch 5 includes plural input terminals (two input terminals 5a and 5b in the example in FIG. 1) and plural output terminals (two output terminals 5c and 5d in the example in FIG. 1). The input terminals 5a and 5b are associated with and connected to the output terminals of the transmit circuits 3 and 4, that is, those of the matching circuits 34 and 44, based on a one-on-one correspondence. The output terminals 5c and 5d are associated with and connected to the antenna terminals 21 and 22 based on a one-on-one correspondence.

The switch 5 selectively connects the output terminal 5c to one of the input terminals 5a and 5b and the output terminal 5d to the other one of the input terminals 5a and 5b. The two input terminals 5a and 5b can thus be connected to the different output terminals 5c and 5d, that is, to the different antennas 12 and 13. As a result, transmit signals input into the two input terminals 5a and 5b can be sent from the different antennas 12 and 13.

(1-3) Operation of Radio-Frequency Module and Communication Apparatus

The operation of the radio-frequency module 1 and the communication apparatus 10 will be described below with reference to FIG. 1.

The signal processing circuit 11 generates transmit signals of the predetermined frequency band (first and second transmit signals) and then outputs the generated transmit signals to the two signal input terminals 23 and 24 of the radio-frequency module 1 via the two signal output terminals 11a and 11b. The transmit signal (first transmit signal) input into the signal input terminal 23 sequentially passes through the first power amplifier 31, the first output matching circuit 32, the first transmit filter 33, and the first matching circuit 34 included in the first transmit circuit 3. The transmit signal in the first communication band is output from the first transmit circuit 3 to one of the antennas 12 and 13 (first antenna) via the switch 5 and is then sent to an external communication partner from the corresponding antenna 12 or 13.

In parallel with processing of the first transmit circuit 3, the transmit signal (second transmit signal) input into the signal input terminal 24 sequentially passes through the second power amplifier 41, the second output matching circuit 42, the second transmit filter 43, and the second matching circuit 44 included in the second transmit circuit 4. The transmit signal in the second communication band is output from the second transmit circuit 4 to the other one of the antennas 12 and 13 (second antenna) via the switch 5 and is then sent to an external communication partner from the corresponding antenna 12 or 13.

In this manner, the first and second transmit signals generated in the signal processing circuit 11 are simultaneously sent from the different antennas 12 and 13.

As described above, in the radio-frequency module 1, the two power amplifiers 31 and 41 are operated at the same time so as to simultaneously send transmit signals in different communication bands. To achieve this operation, the input terminals 31a and 41a of the two power amplifiers 31 and 41 are disposed at certain positions so as not to cause the interference of transmit signals between the two power amplifiers 31 and 41. Examples of the positional arrangement of the input terminals 31a and 41a of the first and second power amplifiers 31 and 41 will be discussed below.

(1-4) Arrangement of Input Terminals of Two Power Amplifiers

An example of the positional arrangement of the input terminals 31a and 41a of the two power amplifiers 31 and 41 will be discussed below with reference to FIGS. 3 and 4.

(1-4-1) Arrangement of Specific Elements (Electronic Components) of Radio-Frequency Module Reference will first be made to FIG. 3 to explain an example of the positional arrangement of specific components (power amplifiers 31 and 41 and output matching circuits 32 and 42) of the radio-frequency module 1 on a mounting substrate 6.

In the following explanation, the specific elements (power amplifiers 31 and 41 and output matching circuits 32 and 42) will simply be called electronic components 20 unless it is necessary to distinguish them from each other.

A first direction X1, a second direction Y1, and a third direction Z1 are defined as follows. The first direction X1 is a direction parallel with a main surface 6a of the mounting substrate 6, which will be discussed later, and the two power amplifiers 31 and 41 oppose each other in this direction (see FIG. 3). The second direction Y1 is a direction parallel with the main surface 6a of the mounting substrate 6 and also perpendicular to the first direction X1 (see FIG. 3). The third direction Z1 is a direction perpendicular to the first direction X1 and also to the second direction Y1, and the thickness direction of the mounting substrate 6 is the third direction Z1 (see FIG. 2).

In the following description, when it is necessary to distinguish the input terminals 31a and 41a of the two power amplifiers 31 and 41 from each other, they may be called a first input terminal 31a and a second input terminal 41a, respectively.

Figure 3:
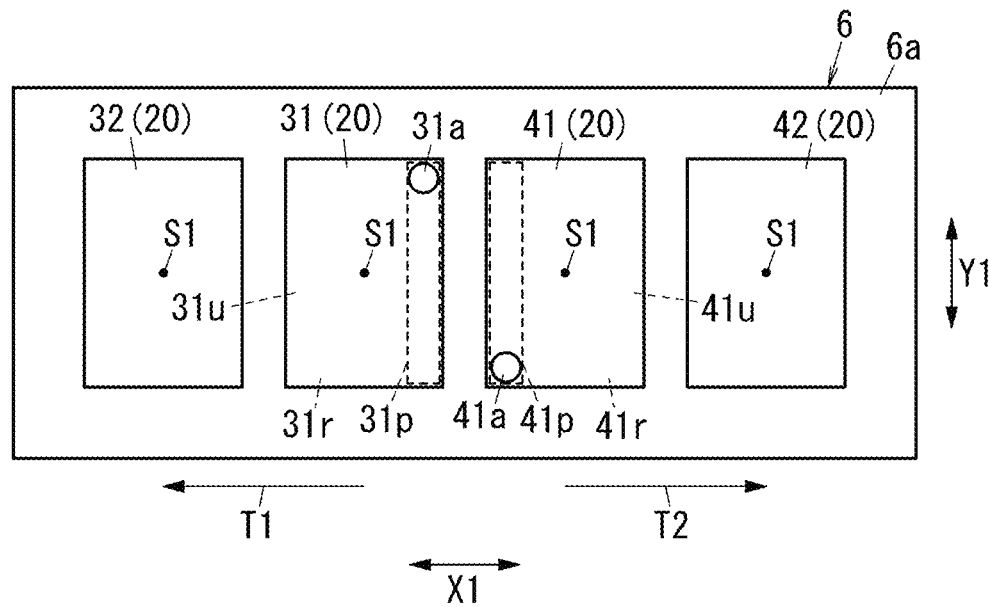
FIG. 3 illustrates an example of the positional arrangement of electronic components of the radio-frequency module.

As shown in FIG. 3, the radio-frequency module 1 includes the mounting substrate 6, as well as multiple elements (that is, the power amplifiers 31 and 41, output matching circuits 32 and 42, matching circuits 34 and 44, and transmit filters 33 and 43). The mounting substrate 6 is a substrate on which the above-described multiple elements are mounted. The mounting substrate 6 is a low temperature co-fired ceramics (LTCC) substrate, a printed wiring board, a high temperature co-fired ceramics (HTCC) substrate, or a multilayer resin substrate, for example.

The mounting substrate 6 has a planar shape, for example, and has a main surface 6a. The main surface 6a is one of the main surfaces of the mounting substrate 6 in the thickness direction. That is, the main surface 6a is one of the two main surfaces which are separated from each other in the thickness direction of the mounting substrate 6 and which intersect with the thickness direction. The electronic components 20 are mounted on the main surface 6a of the mounting substrate 6.

"Being mounted on the main surface 6a of the mounting substrate 6" means that the electronic components 20 are disposed on the main surface 6a of the mounting substrate 6 (mechanically connected to the mounting substrate 6) and/or that the electronic components 20 are electrically connected to conductors of the mounting substrate 6. In the radio-frequency module 1, the electronic components 20 are disposed on the main surface 6a of the mounting substrate 6.

The electronic components 20 each have first and second main surfaces on opposite sides. The electronic components 20 are disposed on the main surface 6a of the mounting substrate 6 so that the first main surfaces of the electronic components 20 face the main surface 6a in the thickness direction of the mounting substrate 6, that is, in the third direction Z1 (see FIG. 2).

Figure 2:
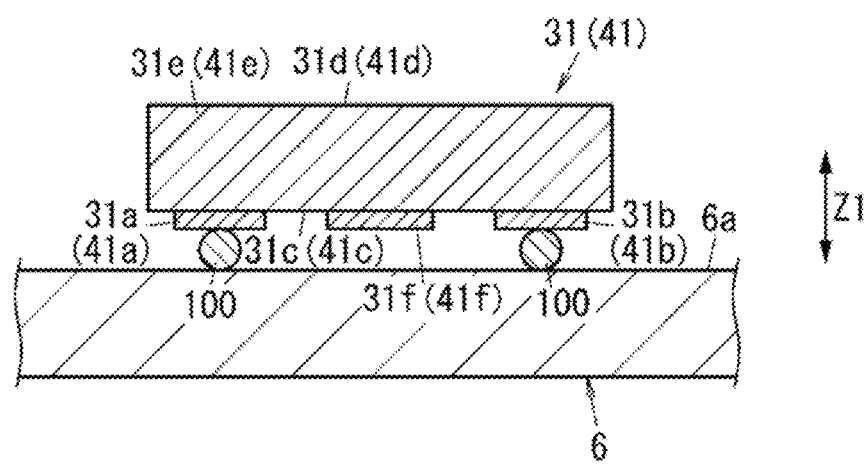
FIG. 2 is a sectional view illustrating the mounting structure of a first power amplifier of the radio-frequency module.

As shown in FIG. 3, the outer shape of the four electronic components 20 are substantially rectangular, as viewed from the third direction Z1 (see FIG. 2). Hereinafter, the outer shape of the electronic components 20 will be the shape of the electronic components 20 as viewed from the third direction Z1. The outer shape of the electronic components 20 has four sides, and more specifically, two pairs of opposing sides. As discussed above, the four electronic components 20 are the power amplifiers 31 and 41 and the output matching circuits 32 and 42.

The four electronic components 20 are arranged side by side in the first direction X1 on the main surface 6a of the mounting substrate 6. More specifically, the centers S1 of the four electronic components 20 are aligned in the first direction X1. The center S1 of each electronic component 20 is the center thereof as viewed from the third direction Z1. One of the two pairs of opposing sides of each electronic component 20 is arranged along the first direction X1, while the other pair is arranged along the second direction Y1.

Among the four electronic components 20, two adjacent electronic components 20 are disposed to oppose each other in the first direction X1. "Opposing each other in the first direction X1" refers to that a side of one electronic component 20 and the associated side of its adjacent electronic component 20 at least partially oppose each other in the first direction X1.

In this manner, among the four electronic components 20, two adjacent electronic components 20 are arranged to oppose each other in the first direction X1. That is, the first and second power amplifiers 31 and 41 oppose each other in the first direction X1. In the first direction X1, the first output matching circuit 32 is disposed at the side of the first power amplifier 31 opposite the side closer to the second power amplifier 41. In the first direction X1, the second output matching circuit 42 is disposed at the side of the second power amplifier 41 opposite the side closer to the first power amplifier 31. The first and second power amplifiers 31 and 41 are sandwiched between the first output matching circuit 32 and the second output matching circuit 42, as viewed from the second direction Y1.

In the first embodiment, with respect to the first direction X1, a first arrangement direction T1 and a second arrangement direction T2 are opposite directions, as shown in FIG. 3. The first arrangement direction T1 is the direction in which the first power amplifier 31 and the first output matching circuit 32 are arranged in this order and in which a transmit signal passes between two processors (from the first power amplifier 31 to the first output matching circuit 32) of the first transmit circuit 3. The second arrangement direction T2 is the direction in which the second power amplifier 41 and the second output matching circuit 42 are arranged in this order and in which a transmit signal passes between two processors (from the second power amplifier 41 to the second output matching circuit 42) of the second transmit circuit 4. In this manner, the first and second arrangement directions T1 and T2 are opposite directions, thereby making it less likely to cause interference between processing in the first transmit circuit 3 and that in the second transmit circuit 4.

(1-4-2) Mounting Structure of Power Amplifiers

The mounting structure of the two power amplifiers 31 and 41 on the mounting substrate 6 will be explained below with reference to FIG. 2.

The first power amplifier 31 is an IC chip including a substrate 31e and a circuit (IC) 31f. The substrate 31e has first and second main surfaces 31c and 31d on opposing sides of the substrate 31e. The circuit 31f is formed on the first main surface 31c of the substrate 31e and has a transistor. The circuit 31f has a function of amplifying a transmit signal input into the input terminal 31a (see FIG. 1) of the power amplifier 31 and outputting the amplified transmit signal from the output terminal 31b (see FIG. 1). The transistor is a heterojunction bipolar transistor (HBT), for example. The input terminal 31a and the output terminal 31b of the first power amplifier 31 are disposed on the outer periphery of the first main surface 31c of the substrate 31e. The IC chip including the first power amplifier 31 is flip-chip mounted on the main surface 6a of the mounting substrate 6 so that the first main surface 31c of the substrate 31e faces the main surface 6a of the mounting substrate 6. That is, the input terminal 31a and the output terminal 31b of the first power amplifier 31 are electrically connected to each other via wiring and bumps 100 formed on the main surface 6a of the mounting substrate 6.

As in the first power amplifier 31, the second power amplifier 41 is an IC chip including a substrate 41e and a circuit (IC) 41f. The substrate 41e has first and second main surfaces 41c and 41d on opposite sides of the substrate 41e. The circuit 41f is formed on the first main surface 41c of the substrate 41e and has a transistor. The input terminal 41a and the output terminal 41b of the second power amplifier 41 are disposed on the outer periphery of the first main surface 41c of the substrate 41e. The IC chip including the second power amplifier 41 is flip-chip mounted on the main surface 6a of the mounting substrate 6 so that the first main surface 41c of the substrate 41e faces the main surface 6a of the mounting substrate 6. That is, the input terminal 41a and the output terminal 41b of the second power amplifier 41 are electrically connected to each other via wiring and bumps 100 formed on the main surface 6a of the mounting substrate 6.

(1-4-3) Arrangement of Input Terminals of Two Power Amplifiers

The positional arrangement of the input terminals 31a and 41a of the two power amplifiers 31 and 41 will be discussed below with reference to FIG. 4.

Figure 4:
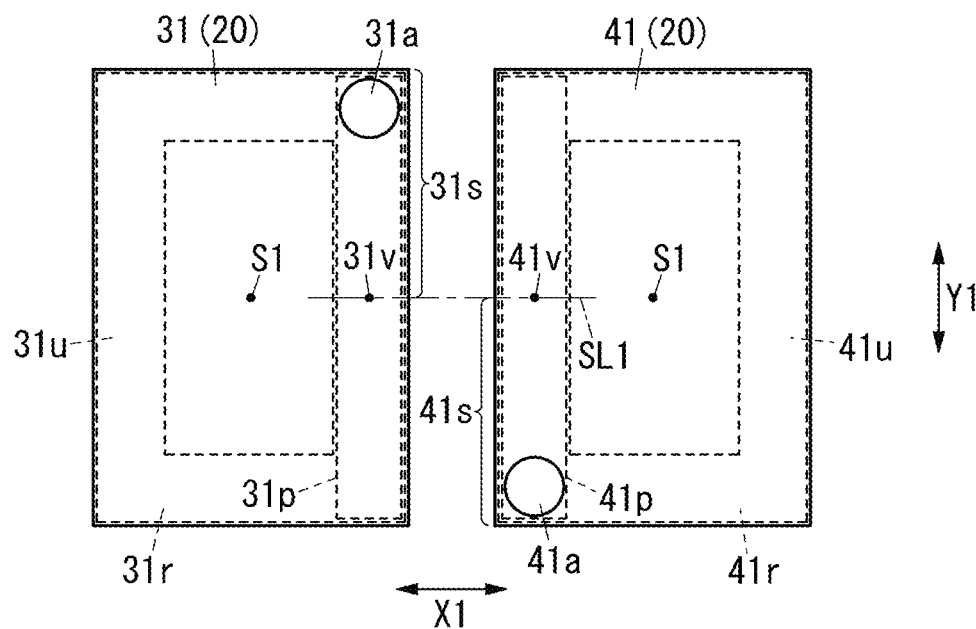
FIG. 4 is a partial enlarged view of some of the electronic components shown in FIG. 3.

In FIG. 4, the first input terminal 31a, a first edge section 31p, and a first outer periphery 31r of the first power amplifier 31 are illustrated so as to be seen through from the second main surface 31d (see FIG. 2) to the first main surface 31c (see FIG. 2) of the first power amplifier 31. In FIG. 4, the first input terminal 41a, a second edge section 41p, and a second outer periphery 41r of the second power amplifier 41 are illustrated so as to be seen through from the second main surface 41d (see FIG. 2) to the first main surface 41c (see FIG. 2) of the second power amplifier 41.

As shown in FIG. 4, the first outer periphery 31r of the first power amplifier 31 includes the first edge section 31p, while the second outer periphery 41r of the second power amplifier 41 includes the second edge section 41p. The first and second edge sections 31p and 41p oppose each other in the first direction X1.

The first edge section 31p of the first power amplifier 31 is an edge section of the outer periphery (first outer periphery 31r) of the first main surface 31c (see FIG. 2) of the first power amplifier 31 and is positioned on the side closer to the second power amplifier 41. In other words, the first edge section 31p is, among the four sides of the outer shape of the first power amplifier 31, an edge section associated with one side of the second power amplifier 41. The second edge section 41p of the second power amplifier 41 is an edge section of the outer periphery (second outer periphery 41r) of the first main surface 41c (see FIG. 2) of the second power amplifier 41 and is positioned on the side closer to the first power amplifier 31. In other words, the second edge section 41p is, among the four sides of the outer shape of the second power amplifier 41, an edge section associated with one side of the first power amplifier 31.

As shown in FIG. 4, regarding the arrangement of the electronic components 20, the first input terminal 31a of the first power amplifier 31 is disposed in the first edge section 31p of the first power amplifier 31. That is, the first input terminal 31a is disposed at a certain position of the first edge section 31p in the second direction Y1. As shown in FIG. 4, the second input terminal 41a of the second power amplifier 41 is disposed in the second edge section 41p of the second power amplifier 41. That is, the second input terminal 41a is disposed at a certain position of the second edge section 41p in the second direction Y1. The first input terminal 31a and the second input terminal 41a are disposed so that they do not overlap each other in the first direction X1.

In FIG. 4, as an example, the first input terminal 31a of the first power amplifier 31 is disposed at one end portion of the first edge section 31p of the first power amplifier 31 in the second direction Y1 (on the top side in FIG. 4). As an example, the second input terminal 41a of the second power amplifier 41 is disposed at the other end portion of the second edge section 41p of the second power amplifier 41 in the second direction Y1 (on the bottom side in FIG. 4).

As a result of disposing the first and second input terminals 31a and 41a as described above, the distance between the first and second input terminals 31a and 41a can be secured. This makes it less likely that transmit signals interfere with each other between the first and second power amplifiers 31 and 41. That is, a transmit signal input into one of the first and second power amplifiers 31 and 41 is less likely to enter the other one of the first and second power amplifiers 31 and 41 as noise. As the distance between the first and second input terminals 31a and 41a in the second direction Y1 is greater, it is less likely that transmit signals interfere with each other between the first and second power amplifiers 31 and 41.

This will be discussed more specifically. It is preferable that, as viewed from the first direction X1, the first input terminal 31a of the first power amplifier 31 be disposed in a first region 31s on one side (top side in FIG. 4) of the first edge section 31p with respect to a center line SL1. In this case, the first input terminal 31a is disposed at a certain position of the first region 31s in the longitudinal direction (second direction Y1). It is also preferable that, as viewed from the first direction X1, the second input terminal 41a of the second power amplifier 41 be disposed in a second region 41s on the other side of the second edge section 41p (bottom side in FIG. 4) with respect to the center line SL1. In this case, the second input terminal 41a is disposed at a certain position of the second region 41s in the longitudinal direction (second direction Y1). With this arrangement, the distance between the first and second input terminals 31a and 41a can be secured easily. As a result, the interference of transmit signals between the first and second power amplifiers 31 and 41 is further reduced.

The center line SL1 is a straight line passing through at least one of a center 31v of the first edge section 31p and a center 41v of the second edge section 41p as viewed from the first direction X1 and also being parallel with the first direction X1. The center 31v of the first edge section 31p is the center thereof in the longitudinal direction (second direction Y1). The center 41v of the second edge section 41p is the center thereof in the longitudinal direction (second direction Y1). In the example in FIG. 4, the center line SL1 passes through the center 31v of the first edge section 31p and the center 41v of the second edge section 41p.

More specifically, it is preferable that, as viewed from the first direction X1, the first input terminal 31a of the first power amplifier 31 be disposed at one end portion of the first edge section 31p in the second direction Y1 (that is, at the position of the first input terminal 31a shown in FIG. 4). It is also preferable that, as viewed from the first direction X1, the second input terminal 41a of the second power amplifier 41 be disposed at the other end portion of the second edge section 41p in the second direction Y1 (that is, at the position of the second input terminal 41a shown in FIG. 4). This can secure a larger distance (the maximum distance in the first embodiment) between the first and second input terminals 31a and 41a. As a result, the interference of transmit signals between the first and second power amplifiers 31 and 41 is even further reduced. In this case, the positional arrangement of the first and second input terminals 31a and 41a is the optimal arrangement in the first embodiment.

In the above-described arrangement of the first and second input terminals 31a and 41a, in the first direction X1, the first output matching circuit 32 is disposed at the side of the first power amplifier 31 opposite the side on which the first input terminal 31a is disposed (see FIG. 3). With this arrangement, an edge section 31u (see FIG. 4) of the outer periphery 31r of the first power amplifier 31 closer to the first output matching circuit 32 can be used as a space for disposing the output terminal 31b (see FIG. 2) of the first power amplifier 31. In the first direction X1, the second output matching circuit 42 is disposed at the side of the second power amplifier 41 opposite the side on which the second input terminal 41a is disposed (see FIG. 3). With this arrangement, an edge section 41u (see FIG. 4) of the outer periphery 41r of the second power amplifier 41 closer to the second output matching circuit 42 can be used as a space for disposing the output terminal 41b (see FIG. 2) of the second power amplifier 41.

(1-5) Modified Examples

Modified examples of the radio-frequency module 1 according to the first embodiment will be described below. In the following description, elements similar to those of the first embodiment are designated by like reference numerals and an explanation thereof may be omitted.

First Modified Example

In the first embodiment, the centers S1 of the four electronic components 20 are uniform in the second direction Y1 (see FIG. 3). In a first modified example, however, the centers S1 of the four electronic components 20 are displaced from each other in the second direction Y1, as shown in FIGS. 5A through 5D.

Figure 5A:
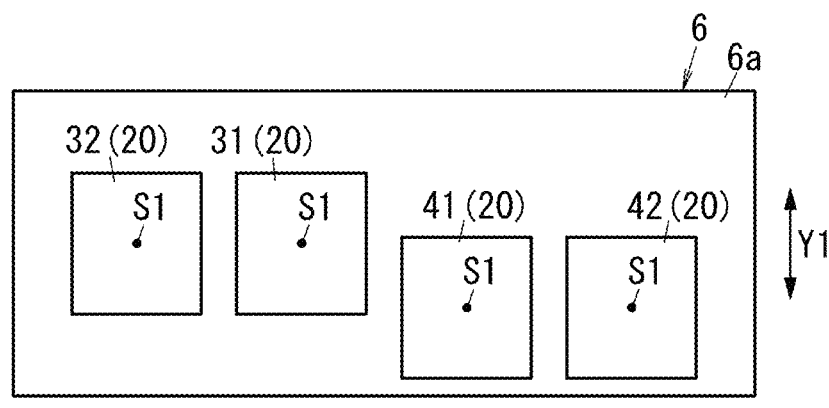
FIGS. 5A through 5D illustrate examples of the positional arrangement of electronic components of a radio-frequency module according to a first modified example of the first embodiment.

In the example in FIG. 5A, the center S1 of the first power amplifier 31 is displaced from that of the second power amplifier 41 toward the top side in the second direction Y1 (top side in FIG. 5A).

Figure 5B:
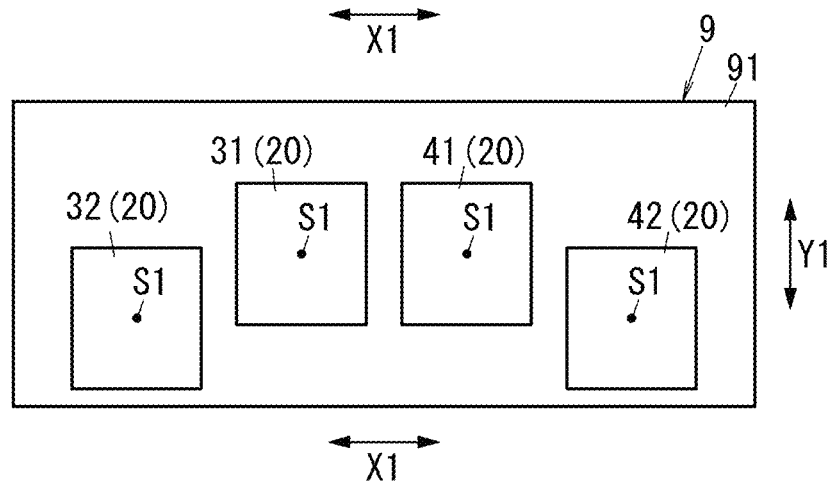

In the example in FIG. 5B, the center S1 of the first output matching circuit 32 is displaced from that of the first power amplifier 31 toward the bottom side in the second direction Y1 (bottom side in FIG. 5B), while the center S1 of the second output matching circuit 42 is displaced from that of the second power amplifier 41 toward the bottom side in the second direction Y1 (bottom side in FIG. 5B).

Figure 5C:
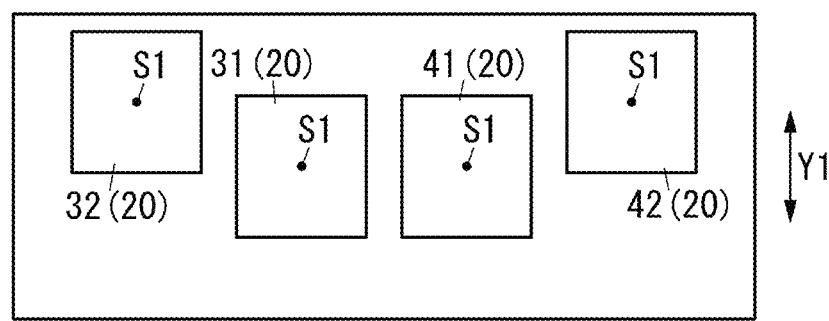

In the example in FIG. 5C, the center S1 of the first output matching circuit 32 is displaced from that of the first power amplifier 31 toward the top side in the second direction Y1 (top side in FIG. 5C), while the center S1 of the second output matching circuit 42 is displaced from that of the second power amplifier 41 toward the top side in the second direction Y1 (top side in FIG. 5C).

Figure 5D:
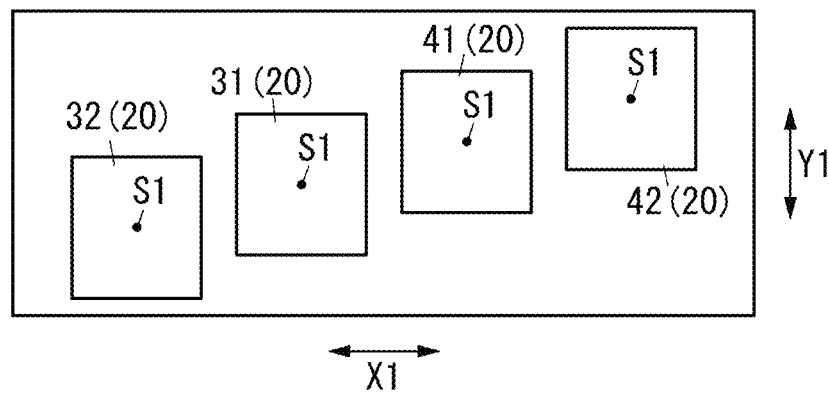

In the example in FIG. 5D, the center S1 of the first power amplifier 31 is displaced from that of the first output matching circuit 32 toward the top side in the second direction Y1 (top side in FIG. 5D). The center S1 of the second power amplifier 41 is displaced from that of the first power amplifier 31 toward the top side in the second direction Y1 (top side in FIG. 5D). The center S1 of the second output matching circuit 42 is displaced from that of the second power amplifier 41 toward the top side in the second direction Y1 (top side in FIG. 5D).

In the first modified example, the following condition is imposed: among the four electronic components 20, a side of one electronic component 20 and the associated side of its adjacent electronic component 20 at least partially oppose each other in the first direction X1. If this condition is satisfied, even if the centers S1 of the four electronic components 20 are displaced from each other in the second direction Y1, the distance between the first and second input terminals 31a and 41a can be secured, as in the first embodiment. It is thus possible to reduce the interference of transmit signals between the first and second power amplifiers 31 and 41.

Second Modified Example

Figure 6:
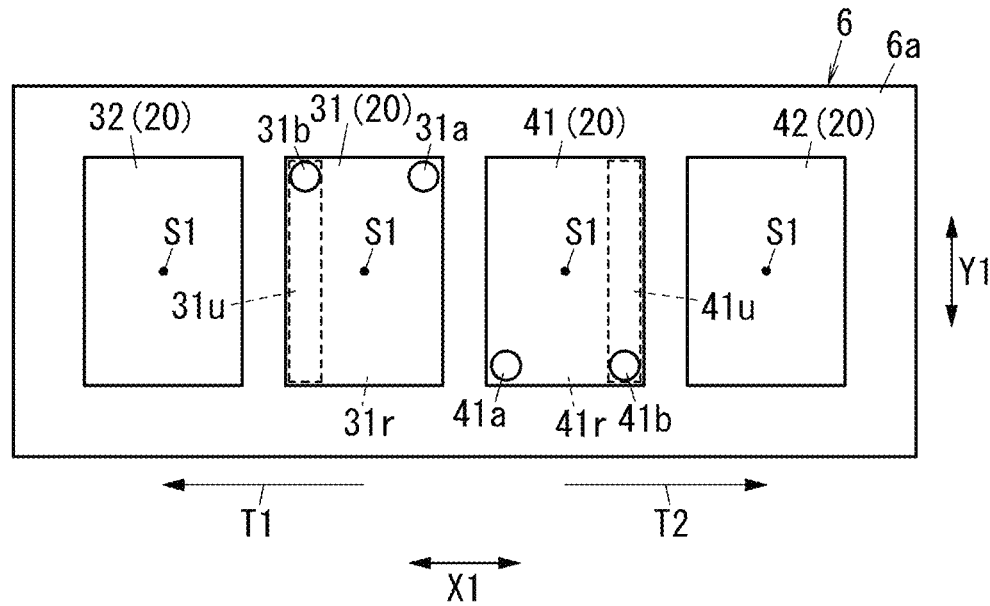
FIG. 6 illustrates an example of the positional arrangement of a first output terminal of a first power amplifier and a second output terminal of a second power amplifier according to a second modified example of the first embodiment.

In a second modified example, in the first embodiment, the output terminals 31b and 41b of the first and second power amplifiers 31 and 41 are disposed, as shown in FIG. 6. More specifically, in the first direction X1, the output terminal 31b of the first power amplifier 31 is disposed in the edge section 31u of the first outer periphery 31r of the first power amplifier 31, which is opposite the side of the first outer periphery 31r closer to the second input terminal 41a of the second power amplifier 41. That is, the output terminal 31b of the first power amplifier 31 is disposed at a certain position of the edge section 31u in the second direction Y1. In the example in FIG. 6, the output terminal 31b of the first power amplifier 31 is disposed at one end portion of the edge section 31u in the second direction Y1 (on the top side in FIG. 6).

In the first direction X1, the output terminal 41b of the second power amplifier 41 is disposed in the edge section 41u of the second outer periphery 41r of the second power amplifier 41, which is opposite the side of the second outer periphery 41r closer to the first input terminal 31a of the first power amplifier 31. That is, the output terminal 41b of the second power amplifier 41 is disposed at a certain position of the edge section 41u in the second direction Y1. In the example in FIG. 6, the output terminal 41b of the second power amplifier 41 is disposed at the other end portion of the edge section 41u in the second direction Y1 (on the bottom side in FIG. 6).

With this arrangement, the distance between the output terminal of one of the two power amplifiers 31 and 41 and the input terminal of the other one of the power amplifiers 31 and 41 can be secured. It thus makes it less likely that an output signal (transmit signal) from the output terminal of one of the power amplifiers 31 and 41 enters the input terminal of the other one of the power amplifiers 31 and 41.

As a result, the interference of transmit signals between the two power amplifiers 31 and 41 can be reduced.

The arrangement of the output terminals 31b and 41b of the first and second power amplifiers 31 and 41 will be discussed more specifically. It is desirable that the output terminal 31b of the first power amplifier 31 be disposed at one end portion of the edge section 31u in the second direction Y1 (that is, at the position of the output terminal 31b shown in FIG. 6). In the second direction Y1, the end portion of the edge section 31u at which the output terminal 31b is disposed is opposite the end portion of the second edge section 41p of the second power amplifier 41 at which the second input terminal 41a of the second power amplifier 41 is disposed. It is also desirable that the output terminal 41b of the second power amplifier 41 be disposed at one end portion of the edge section 41u in the second direction Y1 (that is, at the position of the output terminal 41b shown in FIG. 6). In the second direction Y1, the end portion of the edge section 41u at which the output terminal 41b is disposed is opposite the end portion of the first edge section 31p of the first power amplifier 31 at which the first input terminal 31a of the first power amplifier 31 is disposed.

With this arrangement, a larger distance between the output terminal of one of the two power amplifiers 31 and 41 and the input terminal of the other one of the power amplifiers 31 and 41 can be secured. It thus makes it even less likely that an output signal (transmit signal) from the output terminal of one of the power amplifiers 31 and 41 enters the input terminal of the other one of the power amplifiers 31 and 41. As a result, the interference of transmit signals between the two power amplifiers 31 and 41 can be even further reduced.

(2) Second Embodiment

A radio-frequency module 1 according to a second embodiment will be described below. In the following description, elements similar to those of the first embodiment are designated by like reference numerals and an explanation thereof may be omitted.

Figure 7:
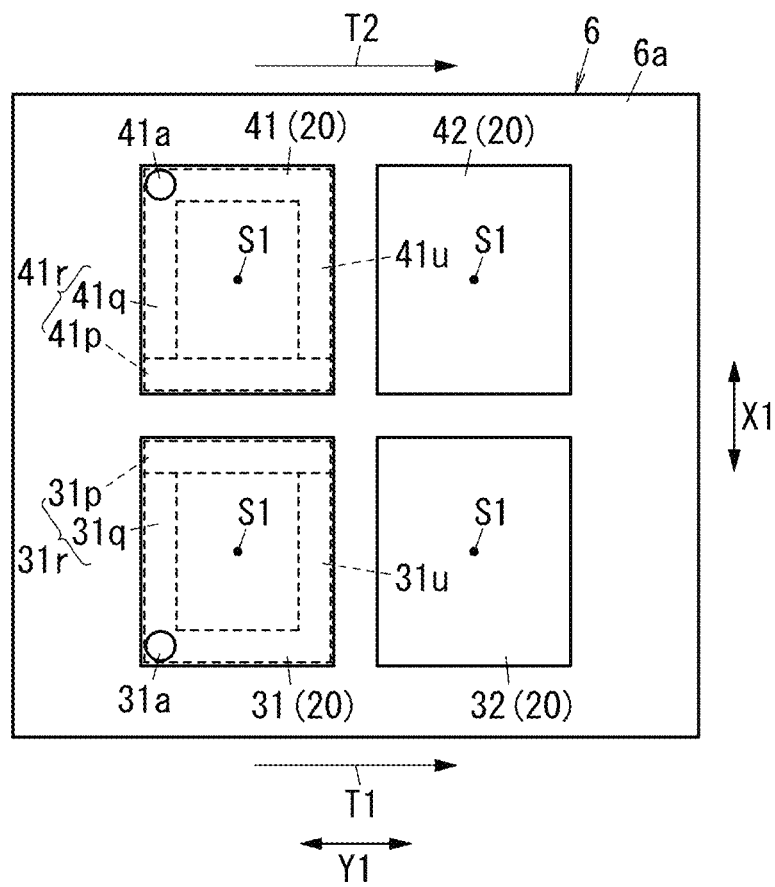
FIG. 7 illustrates an example of the positional arrangement of electronic components of a radio-frequency module according to a second embodiment.

(2-1) Arrangement of Specific Elements (Electronic Components) of Radio-Frequency Module In the first embodiment, the four electronic components 20 are aligned (see FIG. 3). In the second embodiment, four electronic components 20 are arranged in two rows, as shown in FIG. 7. More specifically, the first power amplifier 31 and the first output matching circuit 32 are arranged in one row (first row), while the second power amplifier 41 and the second output matching circuit 42 are arranged in the other row (second row). In the second embodiment, the first and second rows extend in the second direction Y1 and are arranged side by side in the first direction X1.

In the second embodiment, the first and second power amplifiers 31 and 41 oppose each other in the first direction X1. The first power amplifier 31 and the first output matching circuit 32 oppose each other in the second direction Y1. The second power amplifier 41 and the second output matching circuit 42 oppose each other in the second direction Y1. The first and second output matching circuits 41 and 42 oppose each other in the first direction X1. That is, the first and second output matching circuits 32 and 42 are disposed on the same side in the second direction Y1.

More specifically, the center S1 of the first power amplifier 31 and that of the first output matching circuit 32 are aligned in the second direction Y1. The center S1 of the second power amplifier 41 and that of the second output matching circuit 42 are aligned in the second direction Y1. The centers S1 of the first and second power amplifiers 31 and 41 are aligned in the first direction X1.

In the second embodiment, with respect to the second direction Y1, the first arrangement direction T1 and the second arrangement direction T2 are the same direction. Nevertheless, the first row constituted by the first power amplifier 31 and the first output matching circuit 32 and the second row constituted by the second power amplifier 41 and the second output matching circuit 42 are separated from each other as different rows in the first direction X1. This arrangement can reduce the interference between processing in the first transmit circuit 3 and that in the second transmit circuit 4.

(2-2) Arrangement of Input Terminals of Two Power Amplifiers

Regarding the positional arrangement of the four electronic components 20 (see FIG. 7), a first edge section 31p of the first power amplifier 31 and a second edge section 41p of the second power amplifier 41 oppose each other in the first direction X1. The first edge section 31p is an edge section of the outer periphery (first outer periphery 31r) of the first main surface 31c of the first power amplifier 31 and is positioned on the side closer to the second power amplifier 41. The second edge section 41p is an edge section of the outer periphery (second outer periphery 41r) of the first main surface 41c of the second power amplifier 41 and is positioned on the side closer to the first power amplifier 31.

Figure 8:
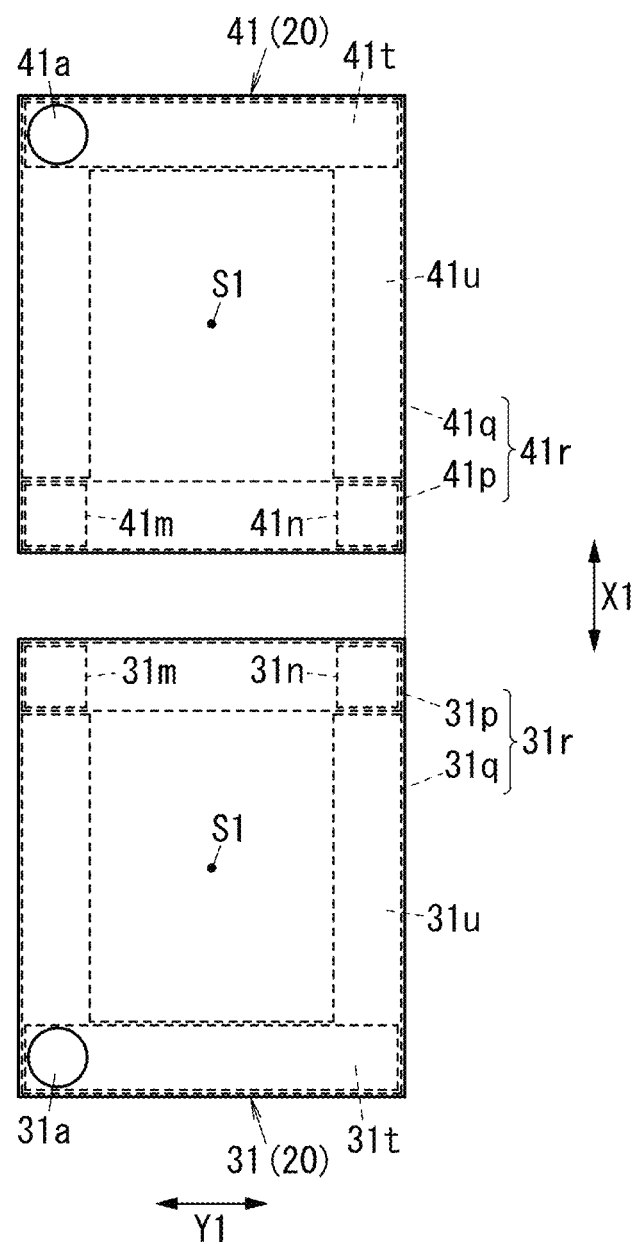
FIG. 8 is a partial enlarged view of some of the electronic components shown in FIG. 7.

As shown in FIG. 8, the first outer periphery 31r includes the first edge section 31p and an edge section 31q, and the first input terminal 31a of the first power amplifier 31 is disposed, not in the first edge section 31p, but in the edge section 31q. That is, the first input terminal 31a is disposed at a certain position of the edge section 31q in the longitudinal direction. The second outer periphery 41r includes the second edge section 41p and an edge section 41q, and the second input terminal 41a of the second power amplifier 41 is disposed, not in the second edge section 41p, but in the edge section 41q. That is, the second input terminal 41a is disposed at a certain position of the edge section 41q in the longitudinal direction. It is desirable that the first and second input terminals 31a and 41a be disposed at positions so that the distance therebetween becomes longer.

In the first power amplifier 31, two corner portions 31m and 31n of the first outer periphery 31r are included in the first edge section 31p, but not in the edge section 31q. Among the four corners of the outer shape of the first main surface 31c of the first power amplifier 31, the two corner portions 31m and 31n are corners corresponding to two of the four corners of the second power amplifier 41. Likewise, in the second power amplifier 41, two corner portions 41m and 41n of the second outer periphery 41r are included in the second edge section 41p, but not in the edge section 41q. Among the four corners of the outer shape of the first main surface 41c of the second power amplifier 41, the two corner portions 41m and 41n are corners corresponding to two of the four corners of the first power amplifier 31.

In the first power amplifier 31, the two corner portions 31m and 31n may alternatively be included in the edge section 31q. In the second power amplifier 41, the two corner portions 41m and 41n may alternatively be included in the edge section 41q. In this case, if the first input terminal 31a is disposed at the corner portion 31m, the second input terminal 41a is not disposed at the corner portion 41m. If the first input terminal 31a is disposed at the corner portion 31n, the second input terminal 41a is not disposed at the corner portion 41n.

In this manner, the first input terminal 31a of the first power amplifier 31 is disposed in the edge section 31q of the first power amplifier 31, while the second input terminal 41a of the second power amplifier 41 is disposed in the edge section 41q of the second power amplifier 41. This makes it possible to secure a distance between the first and second input terminals 31a and 41a. As a result, the interference of transmit signals between the first and second power amplifiers 31 and 41 can be reduced.

More specifically, the first input terminal 31a of the first power amplifier 31 is desirably disposed in a third edge section 31t of the first power amplifier 31, while the second input terminal 41a of the second power amplifier 41 is desirably disposed in a fourth edge section 41t of the second power amplifier 41. The third edge section 31t is part of the first outer periphery 31r of the first power amplifier 31 and opposes the first edge section 31p in the first direction X1. The fourth edge section 41t is part of the second outer periphery 41r of the second power amplifier 41 and opposes the second edge section 41p in the first direction X1. This arrangement makes it possible to secure a larger distance between the first and second input terminals 31a and 41a. As a result, the interference of transmit signals between the first and second power amplifiers 31 and 41 can be even further reduced.

It is desirable that, as viewed from the first direction X1, the first input terminal 31a of the first power amplifier 31 be disposed at one side of the third edge section 31t in the second direction Y1, that is, the side opposite the first output matching circuit 32. The specific position of the first input terminal 31a is shown in FIG. 8. It is desirable that, as viewed from the first direction X1, the second input terminal 41a of the second power amplifier 41 be disposed at one side of the fourth edge section 41t in the second direction Y1, that is, the side opposite the second output matching circuit 42 and the same side as the first input terminal 31a in the third edge section 31t. The specific position of the second input terminal 41a is shown in FIG. 8. This arrangement can secure a larger distance (the maximum distance in the second embodiment) between the first and second input terminals 31a and 41a. As a result, the interference of transmit signals between the first and second power amplifiers 31 and 41 is even further reduced. The positional arrangement of the first and second input terminals 31a and 41a shown in FIGS. 7 and 8 is the optimal arrangement in the second embodiment.

In the optimal arrangement of the first and second input terminals 31a and 41a shown in FIG. 7, in the second direction Y1, the first output matching circuit 32 is disposed at the side of the first power amplifier 31 opposite the side on which the first input terminal 31a is disposed, while the second output matching circuit 42 is disposed at the side of the second power amplifier 41 opposite the side on which the second input terminal 41a is disposed. With this arrangement, an edge section 31u of the first outer periphery 31r of the first power amplifier 31 which faces the first output matching circuit 32 in the second direction Y1 can be used as a space for disposing the output terminal 31b (see FIG. 2) of the first power amplifier 31. An edge section 41u of the second outer periphery 41r of the second power amplifier 41 which faces the second output matching circuit 42 in the second direction Y1 can be used as a space for disposing the output terminal 41b (see FIG. 2) of the second power amplifier 41.

(2-3) Modified Examples

Modified examples of the radio-frequency module 1 according to the second embodiment will be described below. In the following description, elements similar to those of the second embodiment are designated by like reference numerals and an explanation thereof may be omitted. The first embodiment (including the modified examples thereof) and the second embodiment (including the modified examples thereof) may be combined with each other.

First Modified Example

In the second embodiment, the second output matching circuit 42 is disposed on the same side as the first output matching circuit 32 in the second direction Y1 (see FIG. 7). In a first modified example, as shown in FIG. 9, the second output matching circuit 42 is alternatively disposed at the side of the second power amplifier 41 opposite the side closer to the first output matching circuit 32 in the second direction Y1.

In the second embodiment, the first and second input terminals 31a and 41a are optimally disposed on the same side of the third and fourth edge sections 31t and 41t in the second direction Y1 (see FIG. 8). In the first modified example, the first and second input terminals 31a and 41a are optimally disposed at the opposite sides of the third and fourth edge sections 31t and 41t in the second direction Y1 (see FIG. 9).

Figure 9:
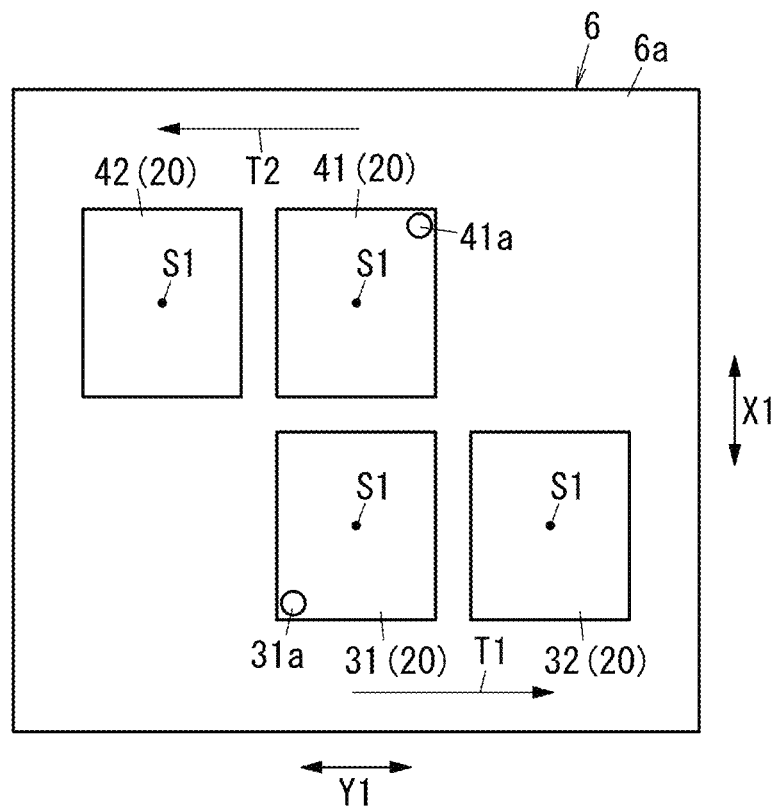
FIG. 9 illustrates an example of the positional arrangement of electronic components of a radio-frequency module according to a first modified example of the second embodiment.

Additionally, in the first modified example, with respect to the second direction Y1, the first arrangement direction T1 and the second arrangement direction T2 are opposite directions, as shown in FIG. 9. This makes it even less likely to cause interference between processing in the first transmit circuit 3 and that in the second transmit circuit 4 than in the second embodiment.

Second Modified Example

Figure 10:
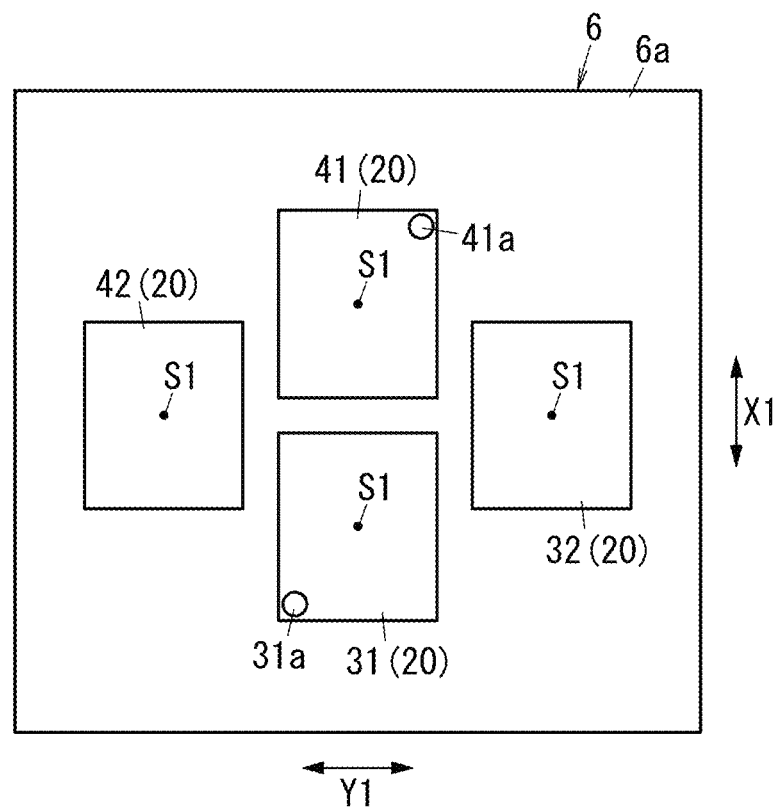
FIG. 10 illustrates an example of the positional arrangement of electronic components of a radio-frequency module according to a second modified example of the second embodiment.

In a second modified example of the second embodiment, the center S1 of the first output matching circuit 32 and that of the first power amplifier 31 are displaced from each other in the first direction X1, as shown in FIG. 10. The center S1 of the second output matching circuit 42 and that of the second power amplifier 41 are also displaced from each other in the first direction X1, as shown in FIG. 10.

In the example in FIG. 10, in the first direction X1, the center S1 of the first output matching circuit 32 and that of the first power amplifier 31 are displaced from each other such that the first output matching circuit 32 opposes both of the first and second power amplifiers 31 and 41. In the first direction X1, the center S1 of the second output matching circuit 42 and that of the second power amplifier 41 are displaced from each other such that the second output matching circuit 42 opposes both of the first and second power amplifiers 31 and 41.

It is desirable, however, that a side of the first power amplifier 31 and the associated side of the first output matching circuit 32 at least partially oppose each other in the second direction Y1 and that a side of the second power amplifier 41 and the associated side of the second output matching circuit 42 at least partially oppose each other in the second direction Y1.

(3) Aspects

In the specification, the following aspects are disclosed.

A radio-frequency module (1) according to a first aspect includes a mounting substrate (6), a first power amplifier (31), and a second power amplifier (41). The mounting substrate (6) has a main surface (6a). The first power amplifier (31) is mounted on the main surface (6a) of the mounting substrate (6) and amplifies a first transmit signal. The second power amplifier (41) is mounted on the main surface (6a) of the mounting substrate (6) and amplifies a second transmit signal. The first power amplifier (31) includes a first input terminal (31a) and a first outer periphery (31r). The first outer periphery (31r) includes a first edge section (31p). The first transmit signal is input into the first input terminal (31a). The second power amplifier (41) includes a second input terminal (41a) and a second outer periphery (41r). The second outer periphery (41r) includes a second edge section (41p) which opposes the first edge section (31p) in a first direction (X1). The second transmit signal is input into the second input terminal (41a). The first input terminal (31a) is disposed in the first edge section (31p) of the first power amplifier (31), while the second input terminal (41a) is disposed in the second edge section (41p) of the second power amplifier (41), and the first input terminal (31a) and the second input terminal (41a) do not overlap each other in the first direction (X1). Alternatively, the first input terminal (31a) is disposed in an edge section (31q) of the first outer periphery (31r) of the first power amplifier (31) other than in the first edge section (31p), and the second input terminal (41a) is disposed in an edge section (41q) of the second outer periphery (41r) of the second power amplifier (41) other than in the second edge section (41p).

With this configuration, the distance between the first input terminal (31a) and the second input terminal (41a) can be secured. As a result, the interference of transmit signals between the first power amplifier (31) and the second power amplifier (41) can be reduced.

In the radio-frequency module (1) according to a second aspect, in the first aspect, communication using the first transmit signal and communication using the second transmit signal are performed simultaneously.

When simultaneously performing communication using the first transmit signal and that using the second transmit signal, the interference of transmit signals between the first power amplifier (31) and the second power amplifier (41) can be reduced.

In the radio-frequency module (1) according to a third aspect, in the first or second aspect, a straight line passing through at least one of a center (31v) of the first edge section (31p) and a center (41v) of the second edge section (41p) as viewed from the first direction (X1) and being parallel with the first direction (X1) is assumed as a center line (SL1). As viewed from the first direction (X1), the first input terminal (31a) is disposed in a first region (31s) on one side of the first edge section (31p) with respect to the center line (SL1). As viewed from the first direction (X1), the second input terminal (41a) is disposed in a second region (41s) on the other side of the second edge section (41p) with respect to the center line (SL1).

This arrangement makes it possible to secure a larger distance between the first input terminal (31a) and the second input terminal (41a). As a result, the interference of transmit signals between the first power amplifier (31) and the second power amplifier (41) can be even further reduced.

In the radio-frequency module (1) according to a fourth aspect, in the third aspect, as viewed from the first direction (X1), the first input terminal (31a) is disposed in one end portion of the first edge section (31p) in a second direction (Y1), which is perpendicular to the first direction (X1). As viewed from the first direction (X1), the second input terminal (41a) is disposed in one end portion of the second edge section (41p) in the second direction (Y1). In the second direction (Y1), the end portion of the second edge section (41p) in which the second input terminal (41a) is disposed is opposite the end portion of the first edge section (31p) in which the first input terminal (31a) is disposed.

This arrangement makes it possible to secure an even larger distance between the first input terminal (31a) and the second input terminal (41a). As a result, the interference of transmit signals between the first power amplifier (31) and the second power amplifier (41) can be even further reduced.

In the fourth aspect, the radio-frequency module (1) according to a fifth aspect further includes a first output matching circuit (32) and a second output matching circuit (42). The first output matching circuit (32) is mounted on the main surface (6a) of the mounting substrate (6) and is connected to an output terminal (31b) of the first power amplifier (31). The second output matching circuit (42) is mounted on the main surface (6a) of the mounting substrate (6) and is connected to an output terminal (41b) of the second power amplifier (41). In the first direction (X1), the first output matching circuit (32) is disposed at a side of the first power amplifier (31) opposite a side on which the first input terminal (31a) is disposed. In the first direction (X1), the second output matching circuit (42) is disposed at a side of the second power amplifier (41) opposite a side on which the second input terminal (41a) is disposed.

With this configuration, it is possible to secure a distance between the first input terminal (31a) and the second input terminal (41a) by taking the positional relationship with the first output matching circuit (32) and the second output matching circuit (42) into consideration.

In the radio-frequency module (1) according to a sixth aspect, in the first or second aspect, in the first direction (X1), the first input terminal (31a) is disposed in a third edge section (31t) of the first outer periphery (31r). The third edge section (31t) opposes the first edge section (31p). In the first direction (X1), the second input terminal (41a) is disposed in a fourth edge section (41t) of the second outer periphery (41r). The fourth edge section (41t) opposes the second edge section (41p).

This arrangement makes it possible to secure an even larger distance between the first input terminal (31a) and the second input terminal (41a).

In the radio-frequency module (1) according to a seventh aspect, in the sixth aspect, as viewed from the first direction (X1), the first input terminal (31a) is disposed in one end portion of the third edge section (31t) in a second direction (Y1), which is perpendicular to the first direction (X1). As viewed from the first direction (X1), the second input terminal (41a) is disposed in one end portion of the fourth edge section (41t) in the second direction (Y1). In the second direction (Y1), the end portion of the fourth edge section (41t) in which the second input terminal (41a) is disposed is the same side as or opposite the end portion of the third edge section (31t) in which the first input terminal (31a) is disposed.

This arrangement makes it possible to secure an even larger distance between the first input terminal (31a) and the second input terminal (41a).

In the seventh aspect, the radio-frequency module (1) according to an eighth aspect further includes a first output matching circuit (32) and a second output matching circuit (42). The first output matching circuit (32) is mounted on the main surface (6a) of the mounting substrate (6) and is connected to an output terminal (31b) of the first power amplifier (31). The second output matching circuit (42) is mounted on the main surface (6a) of the mounting substrate (6) and is connected to an output terminal (41b) of the second power amplifier (41). In the second direction (Y1), the first output matching circuit (32) is disposed at a side of the first power amplifier (31) opposite a side on which the first input terminal (31a) is disposed. In the second direction (Y1), the second output matching circuit (42) is disposed at a side of the second power amplifier (41) opposite a side on which the second input terminal (41a) is disposed.

With this configuration, it is possible to secure a distance between the first input terminal (31a) and the second input terminal (41a) by taking the positional relationship with the first output matching circuit (32) and the second output matching circuit (42) into consideration.

In the radio-frequency module (1) according to a ninth aspect, in one of the first through eighth aspects, the first power amplifier (31) includes a first output terminal (31b) from which the amplified first transmit signal is output. In the first direction (X1), the first output terminal (31b) is disposed in an edge section (31u) of the first outer periphery (31r) of the first power amplifier (31), which is opposite a side of the first outer periphery (31r) closer to the second input terminal (41a) of the second power amplifier (41).

With this configuration, the distance between the first output terminal (31b) of the first power amplifier (31) and the second input terminal (41a) of the second power amplifier (41) can be secured. As a result, the interference of transmit signals between the first power amplifier (31) and the second power amplifier (41) can be reduced.

In the radio-frequency module (1) according to a tenth aspect, in one of the first through ninth aspects, the second power amplifier (41) includes a second output terminal (41b) from which the amplified second transmit signal is output. In the first direction (X1), the second output terminal (41b) is disposed in an edge section (41u) of the second outer periphery (41r) of the second power amplifier (41), which is opposite a side of the second outer periphery (41r) closer to the first input terminal (31a) of the first power amplifier (31).

With this configuration, the distance between the second output terminal (41b) of the second power amplifier (41) and the first input terminal (31a) of the first power amplifier (31) can be secured. As a result, the interference of transmit signals between the first power amplifier (31) and the second power amplifier (41) can be reduced.

A communication apparatus (10) according to an eleventh aspect includes the radio-frequency module (1) according to one of the first through tenth aspects and a signal processing circuit (11). The signal processing circuit (11) outputs the first transmit signal and the second transmit signal to the radio-frequency module (1).

The communication apparatus (10) including the above-described radio-frequency module (1) can be provided.

While embodiments of the disclosure have been described above, it is to be understood that variations and modifications will be apparent to those skilled in the art without departing from the scope and spirit of the invention. The scope of the invention, therefore, is to be determined solely by the following claims.

What is claimed is:

1. A radio-frequency module comprising:
   a mounting substrate having a main surface;
   a first power amplifier that is mounted on the main surface of the mounting substrate and is configured to amplify a first transmit signal; and
   a second power amplifier that is mounted on the main surface of the mounting substrate and is configured to amplify a second transmit signal,
   the first power amplifier including
      a first outer periphery which includes a first edge section, and
      a first input terminal into which the first transmit signal is input,
   the second power amplifier including
      a second outer periphery which includes a second edge section, the second edge section opposing the first edge section in a first direction, and
      a second input terminal into which the second transmit signal is input,
   wherein the first input terminal of the first power amplifier and the second input terminal of the second power amplifier are disposed in one of a first manner and a second manner,
      in the first manner, the first input terminal is disposed in the first edge section of the first power amplifier and the second input terminal is disposed in the second edge section of the second power amplifier, and the first input terminal and the second input terminal do not overlap each other in the first direction, and
      in the second manner, the first input terminal is disposed in a portion of the first outer periphery of the first power amplifier other than in the first edge section, and the second input terminal is disposed in a portion of the second outer periphery of the second power amplifier other than in the second edge section.

2. The radio-frequency module according to claim 1, wherein the first power amplifier is configured to output the first transmit signal after amplification simultaneous with an output by the second power amplifier of the second transmit signal after amplification.

3. The radio-frequency module according to claim 2 wherein:
   under a condition the first input terminal and the second input terminal are disposed in the first manner,
   a straight line passing through at least one of a center of the first edge section and a center of the second edge section as viewed from the first direction and being parallel with the first direction is assumed as a center line,
   as viewed from the first direction, the first input terminal is disposed in a first region on one side of the first edge section with respect to the center line, and
   as viewed from the first direction, the second input terminal is disposed in a second region on the other side of the second edge section with respect to the center line.

4. The radio-frequency module according to claim 3, wherein:
   as viewed from the first direction, the first input terminal is disposed in one end portion of the first edge section in a second direction, the second direction being perpendicular to the first direction; and
   as viewed from the first direction, the second input terminal is disposed in one end portion of the second edge section in the second direction, and in the second direction, the end portion of the second edge section in which the second input terminal is disposed being opposite the end portion of the first edge section in which the first input terminal is disposed.

5. The radio-frequency module according to claim 4, further comprising:
a first output matching circuit that is mounted on the main surface of the mounting substrate and is connected to an output terminal of the first power amplifier; and
a second output matching circuit that is mounted on the main surface of the mounting substrate and is connected to an output terminal of the second power amplifier, wherein in the first direction
the first output matching circuit is disposed at a side of the first power amplifier opposite a side on which the first input terminal is disposed, and
the second output matching circuit is disposed at a side of the second power amplifier opposite a side on which the second input terminal is disposed.

6. The radio-frequency module according to claim 2, wherein, under a condition the first and second input terminals are disposed in the second manner,
in the first direction, the first input terminal is disposed in a third edge section of the first outer periphery, the third edge section opposing the first edge section, and
in the first direction, the second input terminal is disposed in a fourth edge section of the second outer periphery, the fourth edge section opposing the second edge section.

7. The radio-frequency module according to claim 6, wherein:
as viewed from the first direction, the first input terminal is disposed in one end portion of the third edge section in a second direction, the second direction being perpendicular to the first direction; and
as viewed from the first direction, the second input terminal is disposed in one end portion of the fourth edge section in the second direction, in the second direction, the end portion of the fourth edge section in which the second input terminal is disposed being the same side as or opposite the end portion of the third edge section in which the first input terminal is disposed.

8. The radio-frequency module according to claim 7, further comprising:
a first output matching circuit that is mounted on the main surface of the mounting substrate and is connected to an output terminal of the first power amplifier; and
a second output matching circuit that is mounted on the main surface of the mounting substrate and is connected to an output terminal of the second power amplifier, wherein, in the second direction
the first output matching circuit is disposed at a side of the first power amplifier opposite a side on which the first input terminal is disposed, and
the second output matching circuit is disposed at a side of the second power amplifier opposite a side on which the second input terminal is disposed.

9. The radio-frequency module according to claim 1 wherein:
under a condition the first input terminal and the second input terminal are disposed in the first manner,
a straight line passing through at least one of a center of the first edge section and a center of the second edge section as viewed from the first direction and being parallel with the first direction is assumed as a center line,
as viewed from the first direction, the first input terminal is disposed in a first region on one side of the first edge section with respect to the center line, and
as viewed from the first direction, the second input terminal is disposed in a second region on the other side of the second edge section with respect to the center line.

10. The radio-frequency module according to claim 9, wherein:
as viewed from the first direction, the first input terminal is disposed in one end portion of the first edge section in a second direction, the second direction being perpendicular to the first direction; and
as viewed from the first direction, the second input terminal is disposed in one end portion of the second edge section in the second direction, and in the second direction, the end portion of the second edge section in which the second input terminal is disposed being opposite the end portion of the first edge section in which the first input terminal is disposed.

11. The radio-frequency module according to claim 10, further comprising:
a first output matching circuit that is mounted on the main surface of the mounting substrate and is connected to an output terminal of the first power amplifier; and
a second output matching circuit that is mounted on the main surface of the mounting substrate and is connected to an output terminal of the second power amplifier, wherein in the first direction
the first output matching circuit is disposed at a side of the first power amplifier opposite a side on which the first input terminal is disposed, and
the second output matching circuit is disposed at a side of the second power amplifier opposite a side on which the second input terminal is disposed.

12. The radio-frequency module according to claim 9, wherein
the first power amplifier includes a first output terminal from which the amplified first transmit signal is output; and
in the first direction, the first output terminal is disposed in an edge section of the first outer periphery of the first power amplifier, the edge section being opposite to a side of the first outer periphery closer to the second input terminal of the second power amplifier.

13. The radio-frequency module according to claim 9, wherein
the second power amplifier includes a second output terminal from which the amplified second transmit signal is output; and
in the first direction, the second output terminal is disposed in an edge section of the second outer periphery of the second power amplifier, the edge section being opposite to a side of the second outer periphery closer to the first input terminal of the first power amplifier.

14. The radio-frequency module according to claim 1, wherein, under a condition the first and second input terminals are disposed in the second manner,
in the first direction, the first input terminal is disposed in a third edge section of the first outer periphery, the third edge section opposing the first edge section, and in the first direction, the second input terminal is disposed in a fourth edge section of the second outer periphery, the fourth edge section opposing the second edge section.

15. The radio-frequency module according to claim 14, wherein:
as viewed from the first direction, the first input terminal is disposed in one end portion of the third edge section in a second direction, the second direction being perpendicular to the first direction; and
as viewed from the first direction, the second input terminal is disposed in one end portion of the fourth edge section in the second direction, in the second direction, the end portion of the fourth edge section in which the second input terminal is disposed being the same side as or opposite the end portion of the third edge section in which the first input terminal is disposed.

16. The radio-frequency module according to claim 15, further comprising:
a first output matching circuit that is mounted on the main surface of the mounting substrate and is connected to an output terminal of the first power amplifier; and
a second output matching circuit that is mounted on the main surface of the mounting substrate and is connected to an output terminal of the second power amplifier, wherein, in the second direction
the first output matching circuit is disposed at a side of the first power amplifier opposite a side on which the first input terminal is disposed, and
the second output matching circuit is disposed at a side of the second power amplifier opposite a side on which the second input terminal is disposed.

17. The radio-frequency module according to claim 14, wherein
the first power amplifier includes a first output terminal from which the amplified first transmit signal is output; and
in the first direction, the first output terminal is disposed in an edge section of the first outer periphery of the first power amplifier, the edge section being opposite to a side of the first outer periphery closer to the second input terminal of the second power amplifier.

18. The radio-frequency module according to claim 1, wherein
the first power amplifier includes a first output terminal from which the amplified first transmit signal is output; and
in the first direction, the first output terminal is disposed in an edge section of the first outer periphery of the first power amplifier, the edge section being opposite to a side of the first outer periphery closer to the second input terminal of the second power amplifier.

19. The radio-frequency module according to claim 1, wherein
the second power amplifier includes a second output terminal from which the amplified second transmit signal is output; and
in the first direction, the second output terminal is disposed in an edge section of the second outer periphery of the second power amplifier, the edge section being opposite to a side of the second outer periphery closer to the first input terminal of the first power amplifier.

20. A communication apparatus comprising:
a radio-frequency module; and
a signal processing circuit that outputs the first transmit signal and the second transmit signal to the radio-frequency module, wherein the radio-frequency module includes
a mounting substrate having a main surface,
a first power amplifier that is mounted on the main surface of the mounting substrate and is configured to amplify a first transmit signal, and
a second power amplifier that is mounted on the main surface of the mounting substrate and is configured to amplify a second transmit signal,
the first power amplifier including
a first outer periphery which includes a first edge section, and
a first input terminal into which the first transmit signal is input,
the second power amplifier including
a second outer periphery which includes a second edge section, the second edge section opposing the first edge section in a first direction, and
a second input terminal into which the second transmit signal is input,
wherein the first input terminal of the first power amplifier and the second input terminal of the second power amplifier are disposed in one of a first manner and a second manner,
in the first manner, the first input terminal is disposed in the first edge section of the first power amplifier and the second input terminal is disposed in the second edge section of the second power amplifier, and the first input terminal and the second input terminal do not overlap each other in the first direction, and
in the second manner, the first input terminal is disposed in a portion of the first outer periphery of the first power amplifier other than in the first edge section, and the second input terminal is disposed in a portion of the second outer periphery of the second power amplifier other than in the second edge section.

* * * * *